(12) United States Patent
Abbas et al.

(10) Patent No.: US 9,046,348 B2
(45) Date of Patent: Jun. 2, 2015

(54) HEAT TRANSFER METHOD

(75) Inventors: Laurent Abbas, Naibeath, PA (US); Wissam Rached, Chaponot (FR)

(73) Assignee: ARKEMA FRANCE, Colombes (FR)

(*) Notice: Subject to any disclaimer, the term of this patent is extended or adjusted under 35 U.S.C. 154(b) by 0 days.

(21) Appl. No.: 13/144,450

(22) PCT Filed: Jan. 13, 2010

(86) PCT No.: PCT/FR2010/050045
§ 371 (c)(1),
(2), (4) Date: Oct. 3, 2011

(87) PCT Pub. No.: WO2010/081990
PCT Pub. Date: Jul. 22, 2010

(65) Prior Publication Data
US 2012/0017616 A1    Jan. 26, 2012

(30) Foreign Application Priority Data
Jan. 14, 2009 (FR) .................................. 09 50167

(51) Int. Cl.
| | | |
|---|---|---|
| C09K 5/04 | (2006.01) |
| G01B 11/06 | (2006.01) |
| B82Y 10/00 | (2011.01) |
| B82Y 40/00 | (2011.01) |
| G01P 3/80 | (2006.01) |
| H01J 37/317 | (2006.01) |

(52) U.S. Cl.
CPC .............. G01B 11/0691 (2013.01); B82Y 10/00 (2013.01); B82Y 40/00 (2013.01); G01P 3/806 (2013.01); H01J 37/3174 (2013.01)

(58) Field of Classification Search
CPC ........................... C09K 5/045; C09K 2205/24
USPC ......................................................... 252/67
See application file for complete search history.

(56) References Cited

U.S. PATENT DOCUMENTS

| | | | |
|---|---|---|---|
| 5,672,294 A | 9/1997 | Lund et al. | |
| 5,788,886 A | 8/1998 | Minor et al. | |
| 5,866,029 A | 2/1999 | Lund et al. | |
| 6,100,230 A | 8/2000 | Bement et al. | |
| 6,673,259 B2 * | 1/2004 | Cook et al. | ...................... 252/67 |
| 6,814,884 B2 | 11/2004 | Jannick et al. | |
| 8,236,193 B2 | 8/2012 | Fukushima | |
| 2002/0003224 A1 | 1/2002 | Hughes et al. | |
| 2007/0023729 A1 | 2/2007 | Minor | |
| 2009/0030638 A1 | 1/2009 | Lu | |

FOREIGN PATENT DOCUMENTS

FR          2 653 863          5/1991

OTHER PUBLICATIONS

Kosmadakis et al. (2009) Comparative Thermodynamic Study of Refrigerants to Select the Best for USw in the High-Temperature Stage of a Two-Stage Organic Rankine Cycle for RO Desalination, Desalination 243(1-3):74-94.
International Search Report for International Application No. PCT/FR2010/050045, mailed May 21, 2010.

* cited by examiner

Primary Examiner — John Hardee
(74) Attorney, Agent, or Firm — Hunton & Williams LLP

(57) ABSTRACT

The invention relates to a heat transfer method that uses a composition containing from 60 to 95 wt % of 1,1,1,3,3-pentafluoropropane and from 5 to 40 wt % of at least one hydrocarbon selected from n-pentane, isopentane and cyclopentane. The invention more particularly relates to a heat transfer method that successively includes the step of evaporating a refrigerant fluid, a compression step, the step of condensing said fluid at a temperature higher than or equal to 35° C., and preferably between 70° C. and 140° C., and the step of expanding said fluid, characterized in that the refrigerant fluid includes from 60 to 95 wt % of 1,1,1,3,3-pentafluoropropane and from 5 to 40 wt % of at least one hydrocarbon selected from n-pentane, isopentane and cyclopentane.

6 Claims, No Drawings

HEAT TRANSFER METHOD

CROSS-REFERENCE TO RELATED APPLICATIONS

This application is the U.S. National Phase of International Application No. PCT/FR2010/050045, filed Jan. 13, 2010, which claims priority to French Application No. FR 09.50167, filed Jan. 14, 2009.

FIELD OF THE INVENTION

The present invention relates to a heat transfer process using a composition containing pentafluoropropane and at least one hydrocarbon. It relates more particularly to the use of a composition containing pentafluoropropane and at least one hydrocarbon in heat pumps.

BACKGROUND

The problems posed by substances which deplete the atmospheric ozone layer (ODP: ozone depletion potential) were tackled at Montreal, where the protocol imposing a reduction in the production and use of chlorofluorocarbons (CFCs) was signed. This protocol has been the subject of amendments which have required that CFCs be withdrawn and have extended regulatory control to other products.

The refrigeration industry and the air conditioning industry have invested a great deal in the replacement of these refrigerant fluids.

In the automotive industry, the air conditioning systems for vehicles sold in many countries have changed from a chlorofluorocarbon (CFC-12) refrigerant fluid to a hydrofluorocarbon (1,1,1,2-tetrafluoroethane: HFC-134a) refrigerant fluid which is less harmful to the ozone layer. However, from the viewpoint of the objectives set by the Kyoto protocol, HFC-134a (GWP=1300) is regarded as having a high warming potential. The contribution to the greenhouse effect of a fluid is quantified by a criterion, the GWP (Global Warming Potential), which indexes the warming potential by taking a reference value of 1 for carbon dioxide.

In the field of heat pumps, substitutes for dichlorotetrafluoroethane (HCFC-114), used under conditions of high condensing temperature, have been proposed. Thus, document U.S. Pat. No. 6,814,884 describes a composition comprising 1,1,1,3,3-pentafluorobutane (HFC-365mfc) and at least one compound chosen from 1,1,12-tetrafluoroethane, pentafluoroethane (HFC-125), 1,1,1,3,3-pentafluoropropane (HFC-245fa) and 1,1,1,2,3,3,3-heptafluoropropane (HFC-227ea). However, these compositions do not have a very high performance since they have a large temperature glide and a low heat capacity (the heat capacity is less than 60% compared to HCFC-114); moreover, the presence of HFC-227ea and HFC-125 leads to a high GWP.

Document U.S. Pat. No. 5,788,886 discloses compositions of pentafluoropropane and a fluoropropane such as tetrafluoropropane, trifluoropropane, difluoropropane or fluoropropane; 1,1,1,4,4,4-hexafluorobutane; $(CF_3)_2CHCH_3$; 1,1,1,2,3,4,4,5,5,5-decafluoropentane; a hydrocarbon such as butane, cyclopropane, isobutane, propane, pentane; or propylene; or dimethyl ether. This document teaches the use of these compositions especially as refrigerants, cleaning agents and blowing agents.

Binary azeotropic or azeotrope-like mixtures are also disclosed in this document. Mention may especially be made of the binary mixture of 1,1,1,3,3-pentafluoropropane and pentane.

Document U.S. Pat. No. 5,672,294 discloses azeotropic or azeotrope-like compositions of 1,1,1,3,3-pentafluoropropane and at least one hydrocarbon chosen from n-pentane, isopentane, cyclopentane, n-hexane and isohexane. It teaches the use of these compositions as blowing agents in the manufacture of polyurethane and polyisocyanurate foams, and also as an aerosol propellant.

SUMMARY OF THE INVENTION

The applicant has now discovered that compositions containing 1,1,1,3,3-pentafluoropropane and at least one hydrocarbon chosen from n-pentane, isopentane and cyclopentane are very particularly suitable as heat transfer fluid in heat pumps, in particular heat pumps that operate at a high condensing temperature. Moreover, these compositions have a negligible ODP and a GWP below that of existing heat transfer fluids.

A heat pump is a thermodynamic device allowing the transfer of heat from the coldest medium to the hottest medium. The heat pumps used for heating are referred to as compression heat pumps and the operation is based on the principle of the compression cycle of fluids, referred to as refrigerant fluids. These heat pumps operate with compression systems comprising a single or several stage(s). At a given stage, when the refrigerant fluid is compressed and passes from the gaseous state to the liquid state, an exothermic reaction (condensation) takes place that produces heat. Conversely, if the fluid is expanded by passing it from the liquid state to the gaseous state, an endothermic reaction (evaporation) takes place, which produces a cold sensation. Everything therefore relies on the change of state of a fluid used in a closed circuit.

Each stage of a compression system comprises (i) a step of evaporation during which, in contact with heat drawn from the surroundings, the refrigerant fluid, by virtue of its low boiling point, changes from the liquid state to the gaseous state, (ii) a step of compression during which the gas from the preceding step is brought to high pressure, (iii) a step of condensation during which the gas will transmit its heat to the heating circuit; the refrigerant, still compressed, becomes liquid again and (iv) a step of expansion during which the pressure of the fluid is reduced. The fluid is ready for a new absorption of heat from the cold environment.

DETAILED DESCRIPTION OF PREFERRED EMBODIMENTS

One subject of the present invention is a heat transfer process using a compression system having at least one stage successively comprising a step of evaporation of a refrigerant fluid, a step of compression, a step of condensation of said fluid at a temperature greater than or equal to 35° C. and a step of expansion of said fluid characterized in that the refrigerant fluid comprises from 60 to 95 wt % of 1,1,1,3,3-pentafluoropropane and from 5 to 40 wt % of at least one hydrocarbon chosen from n-pentane, isopentane and cyclopentane.

Preferably, the condensing temperature of the refrigerant fluid is between 70 and 140° C., and advantageously between 95 and 125° C.

Preferably, the refrigerant fluid comprises from 66 to 93 wt % of 1,1,1,3,3-pentafluoropropane and from 7 to 34 wt % of at least one hydrocarbon chosen from n-pentane, isopentane and cyclopentane.

The advantageously preferred hydrocarbon is isopentane.

As advantageously preferred refrigerant fluid, mention may especially be made of that comprising:

from 65 to 93 wt % of 1,1,1,3,3-pentafluoropropane and from 7 to 35 wt % of n-pentane;

from 70 to 90 wt % of 1,1,1,3,3-pentafluoropropane and from 10 to 30 wt % of isopentane; and from 70 to 90 wt % of 1,1,1,3,3-pentafluoropropane and from 10 to 30 wt % of cyclopentane.

As particularly preferred refrigerant fluid, mention may especially be made of that comprising:

from 76 to 91 wt % of 1,1,1,3,3-pentafluoropropane and from 9 to 24 wt % of n-pentane;

from 75 to 85 wt % of 1,1,1,3,3-pentafluoropropane and from 15 to 25 wt % of isopentane; and from 72 to 80 wt % of 1,1,1,3,3-pentafluoropropane and from 20 to 28 wt % of cyclopentane.

The refrigerant fluid used in the process according to the present invention may comprise lubricants such as mineral oil, alkylbenzene, polyalkylene glycol and polyvinyl ether.

Another subject of the present invention is a heat pump device containing a refrigerant fluid as described above.

EXPERIMENTAL SECTION

In what follows:
Evap P is the pressure at the evaporator
Cond P is the pressure at the condenser
T cond is the condensing temperature
Te comp is the compressor inlet temperature
Ratio: the compression ratio
T outlet comp is the compressor outlet temperature
COP: coefficient of performance and is defined, where a heat pump is concerned, as being the useful heat power provided by the system over the power taken in or consumed by the system
CAP: volumetric capacity, it is the heat capacity per unit volume (kJ/m$^3$)

% CAP or COP is the ratio of the value of the CAP or COP of the fluid relative to that obtained with HCFC-114.

A: 75 wt % of HFC-365mfc and 25 wt % of HFC-227ea.
B1: 90 wt % of HFC-245fa and 10 wt % of isopentane.
B2: 85 wt % of HFC-245fa and 15 wt % of isopentane.
B3: 80 wt % of HFC-245fa and 20 wt % of isopentane.
C1: 90 wt % of HFC-245fa and 10 wt % of n-pentane.
C2: 85 wt % of HFC-245fa and 15 wt % of n-pentane.
C3: 80 wt % of HFC-245fa and 20 wt % of n-pentane.

Example 1

The performances of the refrigerant fluid under the heat pump operating conditions, with the temperature at the evaporator maintained at 50° C., at the compressor inlet maintained at 65° C. and at the condenser maintained at 120° C., are given below.

For HCFC-114, the nominal operating pressure is 20.8 bar, the volumetric capacity is 2690 kJ/m$^3$ and the COP is 3.3 under the following operating conditions:

Isentropic efficiency of the compressor: 80%

|  | Evap P (kPa) | Cond P (kPa) | Ratio (p/p) | T outlet comp | CAP (kJ/m$^3$) | COPc | % CAP | % COPc |
|---|---|---|---|---|---|---|---|---|
| HCFC-114 | 447 | 2082 | 4.66 | 125 | 2690 | 3.3 | 100 | 100 |
| HFC-245fa | 343 | 1937 | 5.65 | 127 | 2487 | 3.5 | 92 | 105 |
| Isopentane | 205 | 1086 | 5.29 | 116 | 1522 | 3.6 | 57 | 110 |
| HFC-365mfc | 142 | 931 | 6.54 | 115 | 1201 | 3.6 | 45 | 110 |
| A | 177 | 1480 | 8.36 | 126 | 1405 | 3.1 | 52 | 93 |
| Pentane | 159 | 905 | 5.68 | 117 | 1278 | 3.7 | 47 | 112 |
| B1 | 393 | 2072 | 5.27 | 124 | 2650 | 3.4 | 99 | 102 |
| B2 | 409 | 2082 | 5.09 | 122 | 2719 | 3.4 | 101 | 103 |
| B3 | 411 | 2073 | 5.04 | 121 | 2724 | 3.4 | 101 | 103 |
| C1 | 357 | 2010 | 5.62 | 125 | 2592 | 3 | 96 | 105 |
| C2 | 355 | 2001 | 5.64 | 125 | 2581 | 3.5 | 96 | 105 |
| C3 | 340 | 1979 | 5.82 | 125 | 2497 | 3.4 | 93 | 104 |

Example 2

The performances of the refrigerant fluid under the heat pump operating conditions, with the temperature at the evaporator maintained at 80° C., at the compressor inlet maintained at 95° C. and at the condenser maintained at 120° C., are given below.

For HCFC-114, the nominal operating pressure is 20.8 bar, the volumetric capacity is 5867 kJ/m$^3$ and the COP is 6.6 under the following operating conditions:

Isentropic efficiency of the compressor: 80%

|  | Evap P (kPa) | Cond P (kPa) | Ratio (p/p) | T outlet comp | CAP (kJ/m$^3$) | COPc | % CAP | % COPc |
|---|---|---|---|---|---|---|---|---|
| HCFC-114 | 930 | 2082 | 2.24 | 130 | 5867 | 6.6 | 100 | 100 |
| HFC-245fa | 788 | 1937 | 2.46 | 130 | 5810 | 6.8 | 99 | 103 |
| Isopentane | 456 | 1086 | 2.38 | 123 | 3457 | 7.2 | 59 | 109 |
| HFC-365mfc | 352 | 931 | 2.65 | 123 | 3021 | 7.2 | 51 | 110 |
| A) | 436 | 1480 | 3.40 | 133 | 3552 | 5.6 | 61 | 84 |
| Pentane | 367 | 905 | 2.46 | 124 | 2957 | 7.3 | 50 | 110 |
| B1 | 881 | 2072 | 2.35 | 128 | 6104 | 6.8 | 104 | 103 |
| B2 | 901 | 2082 | 2.31 | 127 | 6190 | 6.9 | 105 | 104 |
| B3 | 894 | 2073 | 2.32 | 127 | 6140 | 6.8 | 105 | 104 |
| C1 | 820 | 2010 | 2.45 | 129 | 6061 | 7 | 103 | 104 |
| C2 | 813 | 2001 | 2.46 | 129 | 6026 | 6.8 | 103 | 103 |
| C3 | 780 | 1979 | 2.54 | 130 | 5826 | 6.6 | 99 | 101 |

What is claimed is:

1. A heat transfer process for a compression system comprising at least one stage, said process comprising successively:
   evaporating a refrigerant fluid;
   compressing the evaporated fluid;
   condensing the fluid at a temperature ranging from 70 to 140° C.; and
   expanding the fluid;
   wherein the refrigerant fluid consists of:
      60 to 95 wt % of 1,1,1,3,3-pentafluoropropane and
      5 to 40 wt % of at least one hydrocarbon selected from the group consisting of n-pentane or isopentane.

2. The process of claim 1, wherein the fluid is condensed at a temperature ranging from 95 to 125° C.

3. The process of claim 1, wherein the refrigerant fluid consists of:
   66 to 93 wt % of 1,1,1,3,3-pentafluoropropane, and
   7 to 34 wt % of the at least one hydrocarbon.

4. The process of claim 1, wherein the hydrocarbon consists of isopentane.

5. The process of claim 1, wherein the refrigerant fluid consists of:
   76 to 91 wt % of 1,1,1,3,3-pentafluoropropane, and
   9 to 24 wt % of n-pentane.

6. The process of claim 1, wherein the refrigerant fluid consists of:
   75 to 85 wt % of 1,1,1,3,3-pentafluoropropane, and
   15 to 25 wt % of isopentane.

\* \* \* \* \*